United States Patent
Kush, Jr. et al.

[11] 3,931,581
[45] Jan. 6, 1976

[54] HIGH-EFFICIENCY, SWITCHING, POWER AMPLIFIER

[75] Inventors: Louis J. Kush, Jr., State College; Claus P. Janota, Lemont; Richard D. Koontz, Pennsylvania Furnace; Leon H. Sibul, State College, all of Pa.

[73] Assignee: The United States of America as represented by the Secretary of the Navy, Washington, D.C.

[22] Filed: Sept. 30, 1974

[21] Appl. No.: 510,189

[52] U.S. Cl. .................. 330/10; 307/253; 330/146
[51] Int. Cl.² .................... H03F 3/217; H03F 3/387
[58] Field of Search ............. 330/146, 10; 307/253

[56] References Cited
UNITED STATES PATENTS

| | | | |
|---|---|---|---|
| 3,579,132 | 5/1971 | Ross | 307/253 X |
| 3,694,764 | 9/1972 | Barron | 330/146 |

*Primary Examiner*—Siegfried H. Grimm
*Attorney, Agent, or Firm*—R. S. Sciascia; P. Schneider; W. T. Ellis

[57] ABSTRACT

A switching power amplifier for use in low-frequency sonar applications. This amplifier comprises a set of four switching transistors arranged in a bridge configuration for switching a power source through a highly resonant, low-frequency, underwater transducer. The signal to be amplified is taken from a signal generator, filtered, converted to voltage logic levels, delayed and modified a predetermined amount in time to prevent a power short circuit through the bridge due to slow transistor switching, and applied to a set of four voltage transformers. A different voltage transformer is coupled to each of the switching transistors in the bridge circuit. These voltage transformers are coupled to switch their respective bridge transistors only when their primary currents are collapsing, thus effectively decoupling the bridge transistors and the power source from the signal conditioner and driver delay circuitry.

An inductance is connected in electrical series with the underwater transducer to form a series resonant circuit with the transducer's shunt capacitance. This resonant circuit converts the squarewave output from the bridge to its sinewave fundamental so that it may be applied to drive the transducer. This resonant circuit also protects the transducer from short circuit currents and voltages.

8 Claims, 4 Drawing Figures

HIGH-EFFICIENCY, SWITCHING, POWER AMPLIFIER

FIELD OF THE INVENTION

The present invention is related generally to electronic amplifiers and in particular to high-power, switching amplifiers.

DESCRIPTION OF THE PRIOR ART

Sonar applications are generally restricted to the lower frequencies due to the better water transmission characteristics at these frequencies. Low-frequency, highly resonant transducers must be used for sonar transmissions at these low frequencies. Presently, push-pull power amplifiers with center-tap transformers are used to drive the highly-resonant transducers. The basic problem with the use of this type of amplifier is that it is highly inefficient power-wise. The primary cause of the inefficiency is the high primary-to-primary leakage inductance normally found in this type of transformer configuration. This leakage inductance slows down considerably the switching of the power transistors. This slow switching increases the transistor power losses, since the power transistors operate in a high-energy dissipation region.

A further problem arises with the use of push-pull power amplifiers in that high voltage spikes induced by this leakage inductance of the center-tapped transformer can damage the power transistors. To prevent such damage, Zener diodes must be used to hold the voltage constant across the power transistors. These Zener diodes also dissipate power during switching.

A related problem with this type of amplifier configuration occurs due to the absence of any failure protection circuitry. Thus the occurrence of a short circuit almost anywhere in the driving circuitry can damage the power transistors and even the transducer itself.

SUMMARY OF THE INVENTION

Briefly, the present invention comprises a high-efficiency, bridge, amplifier system for driving a transducer with a paticular frequency or with a noise signal.

The system comprises:

A signal conditioner for converting a desired transmission signal to voltage logic levels;

A driver delay circuit connected to the output of the signal conditioner for inserting a predetermined time delay before the occurrence of each new voltage logic level;

A set of switching means arranged in a bridge configuration for connecting a power source to the transducer load; and A set of voltage transformers, a different one coupling to each switching means, the set of voltage transformers being connected to the driver delay logic so that the voltage transformers coupled to the switching means in opposite arms of the bridge are energized together in accordance with the logic levels from the driver delay circuit.

The delay inserted by the driver delay circuit is for the purpose of preventing a short circuit through the bridge due to the slow turn-off time of the bridge switching means. The voltage transformers coupled to the switching means are for the purpose of isolating the driver circuitry from the switching means. The senses of the windings for each of the voltage transformers are chosen so that the switching means coupled to that transformer is only switched when the current in its respective primary is collapsing. This feature prevents a driver short circuit from damaging the switching means.

A series resonant circuit is located at the input to the transducer to convert the squarewave output from the bridge to its sinewave fundamental to drive the transducer at this frequency. This resonant circuit also functions to protect the transducer from short circuits since it presents a high impedance when it is no longer at resonance.

OBJECT OF THE INVENTION

An object of the present invention is to drive a transducer load with a high-power, bridge, switching amplifier.

A further object is to increase the efficiency of a high-power, bridge amplifier.

A still further object is to safeguard the driver and amplifier stages and the transducer from short-circuit currents and voltages.

Other objects, advantages, and novel features of the present invention will become apparent from the following detailed description of the invention when considered in conjunction with the accompanying drawings.

BRIEF DESCRIPTION OF THE DRAWING

Referring to the drawings, FIG. 2a and 2b present a schematic circuit diagram of a high-power, switching amplifier that may be used to drive an underwater transducer in accordance with a desired voltage signal. The switching means (i.e., power transistors) 10, 12, 14, and 16 (see FIG. 2b) form a power, bridge circuit for connecting a voltage source 32 through a transformer-coupled transducer load to a ground 38. it is to be understood that the number of transistors per arm of the bridge is not restricted to one transistor, but for clarity, only one transistor is shown in each arm.

Figure 1:
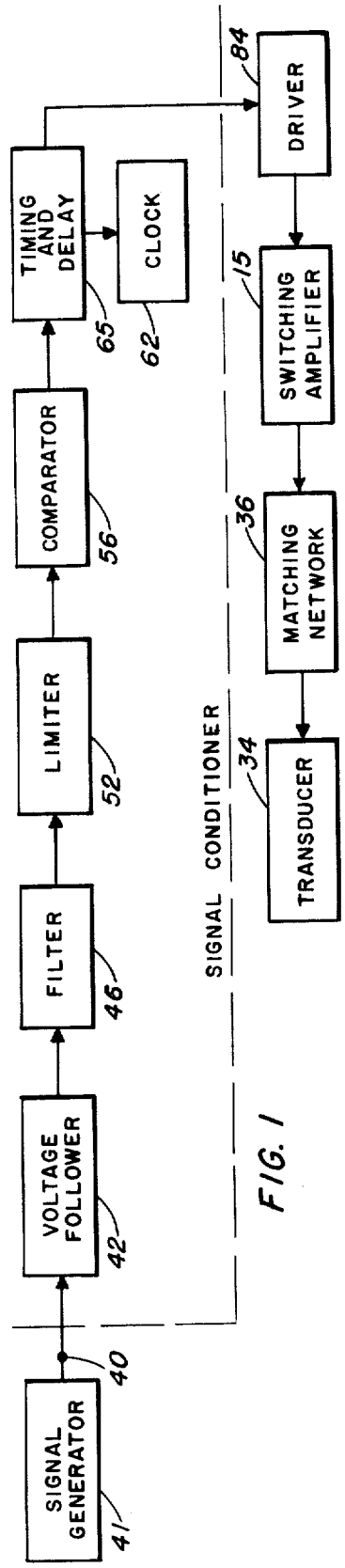
FIG. 1 is a block diagram of the switching power amplifier of the present invention.
Figure 2B:
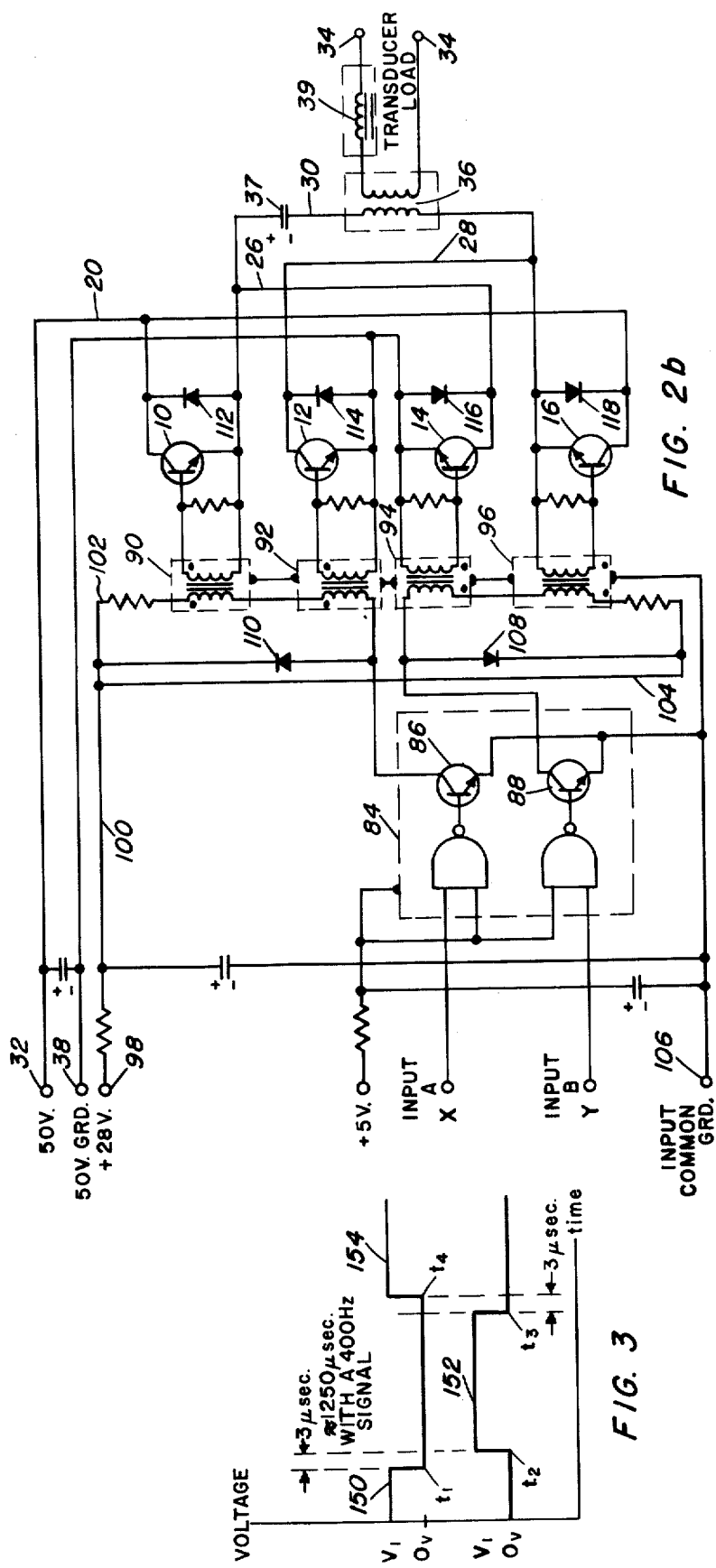
FIGS. 2a and 2b are a schematic circuit diagram of one embodiment of the present invention.

The power transistors 10 and 12 are connected so that they are driven simultaneously. Likewise, the power transistors 14 and 16 are connected so that they are driven simultaneously. A transducer load connected at the terminals 34 is coupled to the line 30 by way of the voltage transformer 36.

This transformer 36 is energized by the power source 32 in the following manner. When the transistors 10 and 12 are biased on simultaneously, a current path exists from the power source 32, through the collector and emitter of the transistor 10, down the line 30, through the transformer 36, up line 28, through the collector and the emitter of the transistor 12, and back to the ground 38. Likewise, when the transistors 14 and 16 are biased on simultaneously, a current path exists from the power source 32, down the line 20, through the collector and the emitter of the transistor 16, up the line 30, through the transformer 36, down the line 26, through the collector and the emitter of the transistor 14, and back to the ground 38. Thus the voltage polarity at the transformer 36 is reversed upon switching of the power transistor pairs.

The use of a switching bridge circuit to drive a transducer load has a number of advantages. There is no inductance leakage since no center-tapped, push-pull, transformers are used. Thus the transistor switching is much faster than in the common push-pull, power amplifier since there is no primary-to-primary inductance leakage to oppose the transistor voltage changes. Furthermore, the problem of high-voltage spikes induced by the leakage inductance is obviated.

A basic, power-efficiency problem arises when a switching bridge circuit is used to switch a power source to a load. This problem is due to the fact that transistors can be switched to a conducting state much faster than they can be switched off. Thus, if the transistors 10 and 12 have been biased on for a predetermined time (pulse-time) and then they are suddenly biased off and the transistors 14 and 16 are biased on, there is a short time period during which there exists a short circuit to ground 38 by way of the line 28 and the transistor 12. Thus, a certain amount (approximately 10%) of power is lost directly to ground until the transistor 12 stops conducting.

Likewise, when the transistors 14 and 16 have been conducting and they are switched off and the transistors 10 and 12 switched on, there exists a short circuit to the ground 38 down the line 26 and through the still conducting transistor 14. Thus, on every switching of the two transistor pairs, an initial amount of power is lost to ground, giving this configuration a low-efficiency, power rating.

Figure 2A:
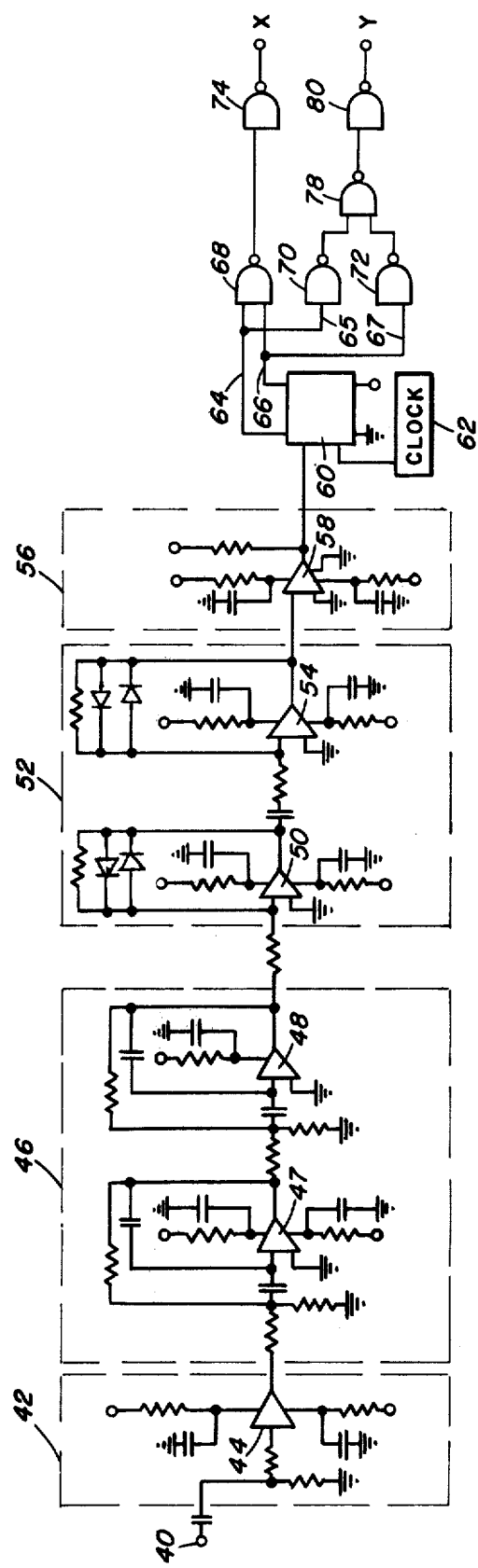

In order to obviate this short-circuit problem, a logic delay circuit is inserted in the drive circuitry providing switching voltages to the bridge transistors. This drive circuitry preceding the bridge will now be described. The signal to be transmitted is applied at the lead 40 (see FIG. 2a) from a voltage generator or transmitter (not shown). The lead 40 is coupled directly to a voltage-follower, buffer amplifier 44 shown with its attendant biasing circuitry in the dashed line box 42. This buffer amplifier supplies the proper impedance matching between the signal generator (not shown) and the filter circuitry.

The output from the buffer amplifier 44 is applied to an electrical filter (dashed line box 46), to restrict the voltage to a desired band of frequencies. An active, two-stage, two-pole, Butterworth filter may be used, for example, to restrict the voltage waveform to a desired frequency band. This type of filter is shown within the dashed line box 46. This filter is implemented through the use of the operational amplifiers 47 and 48.

The output from the filter 46 is applied to a set of voltage limiters 50 and 54 shown with their attendant biasing circuitry within the dashed-line box 52. These limiters 50 and 54 form a two-stage amplifier/clipper which prevents signal jitter during the power-amplifier-switching action. The amplifier/clipper 52 receives the filtered signal from the filter 46 and may, for example, converts it to a +½ volt pulse if it has a positive polarity, and to a —½ volt pulse if the signal has a negative polarity.

This positive/negative clipped signal is applied to a voltage comparator 58 enclosed with all of its attendant biasing circuitry in the dashed-line box 56. This comparator 58 merely transforms this positive/negative, clipped signal to positive logic levels so that standard logic modules may be used in the driver delay circuitry following. Thus, if the signal is at +½ volt, then it may be converted to +5 volts, for example, while if it is at —½ volt, then it may be converted to 0 volts.

Figure 3:
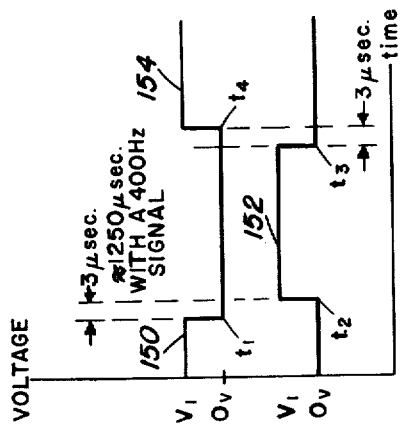
FIG. 3 is a voltage vs time plot of the voltage logic level signals.

These logic level signals from the comparator 58 are applied to a logic delay circuit as mentioned above for the purpose of inserting a sufficient delay between power switching events so that a direct-current, short-circuit directly to ground (due to slow transistor turn-off time) in the bridge circuit cannot occur. The required delay in switching is determined by the transistor-turn-off time for the transistor 10, 12, 14, and 16 used in the power amplifier bridge configuration. For example, a 3$\mu$sec.turn-off time requires a 3$\mu$sec.delay insertion. This is illustrated in FIG. 3 with a 400 Hz signal (2500$\mu$sec.period). The positive voltage pulse 150 is applied to the transistors 10 and 12. At the time $t_1$ the pulse drops down to 0 volts. Due to the 3$\mu$sec. transistor turn-off time (chosen for this example), the transistors 10 and 12 are still conducting. Thus a 3$\mu$sec.delay is inserted so that the pulse 152 is applied to the transistors 14 and 16 at time $t_2$. This delay permits the transistor 12 to turn-off thus preventing a short circuit to ground. Likewise, when the pulse 152 drops to 0 volts at the time $t_3$, a 3$\mu$sec.delay is inserted before the pulse 154 is applied to the transistors 16 and 18, thus preventing a short-circuit through the transistor 14.

This predetermined delay is inserted before each voltage level change in the following manner. The logic level signals (0 and 5 volts in this example) are applied to a shift register 60. If a 3$\mu$sec.delay is to be inserted, a four-stage shift register may be used. A 1 megahertz clock signal generated by the clock 62 is applied to one terminal of the shift register 60 to shift the voltage levels through the register stages. The first and fourth stage values are sampled by the lines 64 and 66 respectively and applied to the two inputs of a positive NAND gate 68. The output from this gate 68 is then applied through a positive NAND gate 74.

The output from the gate 74 is applied to the transistor 86 in a relay driver chip 84. The transistor 86, when biased off, biases, in a manner to be discussed later, the bridge transistors 10 and 12 into a conductive state. The driver chip may be, for example, a TEXAS Instruments SN7541 driver chip.

The signal on the line 64 is also applied via line 65 to a positive NAND gate 70, while the signal on the line 66 is applied via line 67 to a positive NAND gate 72. The outputs from gates 70 and 72 are applied to first and second inputs of a positive NAND gate 78, and the output of gate 78 is applied to the input of a positive NAND gate 80.

This logic gate circuitry operates as follows. When a +5 volt pulse is applied to the first stage of the shift register 60 for approximately 1250$\mu$sec., it is applied by the line 64 to the positive NAND 68 for this same length of time. The clock 62 shifts this voltage level after 1$\mu$sec. to the second stage of the register 60, after 2$\mu$sec. to the third stage, and after 3$\mu$sec. to the fourth stage. When this voltage level reaches the fourth stage after 3$\mu$sec., it is applied via the line 66 to the positive NAND gate 68. Since both the inputs to the gate 68 are now energized, a zero output voltage is applied by the gate 68 to the positive NAND gate 74. The gate 74 converts this 0 to a 1. Thus a positive logic 1 pulse is sent down the line after a 3$\mu$sec. delay to bias the transistor 86 into conduction, and thus eventually to bias to transistors 10 and 12 into conduction.

When a 0 volt pulse is applied to the first stage of the shift register 60 for approximately 1250μsec., the gate 68 immediately changes its output signal to a +1 (since the line 64 is no longer a positive voltage). This +1 volt level is converted to a 0 volt level by the gate 74 and is then applied to the relay driver chip to turn-off the transistor 86.

This 0 volt level in the first stage of the register 60 is also applied via the lines 64 and 65 to the positive NAND gate 70. where it is converted to a +1 voltage level and applied to the positive NAND gate 78 as one input. After 3μsec. have elapsed and this 0 volt level has been shifted through the register to its fourth stage, a 0 volt level is applied via the lines 66 and 67 to the positive NAND gate 72. The gate 72 converts this 0 volt level to a +1 volt level and applies it as the second input to the gate 78. Since both of the inputs to the gate 78 are +1 volt levels, the gate 78 generates a 0 volt level and applies it to the positive NAND gate 80 which converts the signal back to a +1 volt level. This +1 volt level is applied to the base of the transistor 88 to bias it into a conductive state thus permitting the eventual biasing of the bridge transistors 14 and 16 into a conductive state by the flux change caused by the shutting-off of the transistor 88 (to be explained later).

It is to be understood that a delay of almost any length may be inserted before a positive pulse merely by using a faster or slower clock and/or by changing the number of stages in the shift register 60.

The actual coupling of the relay driver 84 to the bridge transistors will now be discussed. This circuitry is designed basically to isolate the driver circuitry and the amplifier power source. To accomplish this, a set of four transformers are used. Each of the power transistors 10, 12, 14, and 16 is coupled to the secondary winding of the voltage transformers 90, 92, 94, and 96, respectively. A power source 98 of, for example, 28 volts is connected through the primaries of each of the transformers and through the relay driver 84 to a ground potential 106. Specifically, the power source 28 is connected by way of the lines 100 and 102, the primaries of the transformers 90 and 92, the collector and emitter of the transistor 86 of the relay driver 84, to ground 106. Likewise, the power source 28 is coupled by way of the lines 100 and 104, the primaries of the transformers 96 and 94, and the collector and emitter of the transistor 88 of the relay driver 84, to ground 106. The diodes 110 and 108, connected across the transformer primaries of the transformers pairs 90 and 92, and 94 and 96 respectively, provide a current path back to the voltage source 98, so that when the relay driver transistor for either one of the pairs of primaries shuts off, the voltage across that pair of primaries dissipates in a gradual manner, thus inducing a moderate opposing voltage in the secondaries for that pair of primaries.

The operation of this circuitry is as follows. When a positive voltage pulse biases the transistor 86 into a conductive state for 1250μsec. (assuming a 400 Hz frequency), the current has a path from the power source 98 through the primary windings of the transformers 90 and 92, the transistor 86, to the ground 106. The change in flux due to the charging of these primaries induces a voltage opposing this flux change in the respective secondaries of these transformers. The sense of the windings of the transformer secondaries is chosen so that this initial induced voltage biases the transistors 10 and 12 to a nonconductive state. When the voltage biasing the transistor 86 switches from a positive value to zero, the transistor 86 becomes nonconductive, and the current path through the primaries of the transformers 90 and 92 from power source 32 is broken. Thus these primaries stop charging and their flux field begin to collapse, with the effect of inducing a voltage opposed to this flux change in the respective secondaries of these transformers. This induced secondary voltage opposing this flux collapse in the primary is sufficient to bias the transistors 10 and 12 into a conductive state for approximately 1250μsec. (asuming a 400 HZ frequency), thus switching the power on from the power source 32, through the transistor 10, the line 30, the primary of the transformer 30, the line 28, the transistor 12, to the ground 38. Likewise, when the transistor 88 is biased into a conductive state by a positive voltage (1250μsec. for 400 Hz frequency) the current has a path from the power source 98 through the primary windings of the transformers 94 and 96, the transistor 88, to the ground 106. Due to this current charging of the primaries of the transformers 94 and 96, a voltage opposing this primary flux change is induced in their respective secondaries. The sense of the windings of the transformer secondaries is again chosen so that this initial, induced, secondary voltage biases the transistors 14 and 16 to a nonconductive state. When the positive voltage to the transistor 88 changes to zero voltage, the transistor 88 becomes nonconductive and the current path through the primaries of the transformers 94 and 96 from power source 32 is broken. Thus the flux field in these primaries beings to collapse, with the effect ofinducing a voltage opposed to this flux changes in the respective transformer secondaries. This induced voltage biases the transistors 14 and 16 into a conductive state thus switching the power from the power source 32 through the transistor 16, the line 30, the primary of the transformer 36, the line 26, the transistor 14, to the ground 38. This conductive state lasts for approximately 1250μsec. The diodes 112, 114, 116, and 118 connected across the collector and the emitter of the transistors 10, 12, 14, and 16 respectively, provide a path back to the power source 32 when all of these transistors are in a nonconductive state. This path back to the power source provides an outlet for the stored energy in the transformer 36.

The use of this type of circuitry in the coupling between the driver and the bridge has a number of advantages. First, the relay driver 84 is isolated from the main power source 32 by the transformers 90, 92, 94, and 96. Second, due to the choice of the sense of the transformer windings, if there is a short circuit from the voltage source 98 through one of the pairs of transformer primaries to the ground 106, the secondary windings for those respective primaries bias their respective transistors further into a nonconductive state. Thus the switching transistors 90, 92, 94, and 96 are protected from any short circuits in the driver circuitry since the switching transistors are only biased on when the primary current is collapsing. A third feature of this circuitry is that it provides for a positive turn-off of the bridge amplifier stage in the no-signal case. This feature provides turn-on protection and safe operation of the bridge in the case of a driving signal loss.

A fourth advantage to the use of these transformer couplings is that they reduce the power losses in the driver circuitry by allowing for higher voltages with lower currents. The fifth advantage, mentioned again for emphasis, is that this circuitry permits (through the elimination of the need for a center-tapped transformer) a very high speed switching of the power transistors 10, 12, 14, and 16 (less than 1 μsec) thereby reducing the time during which power dissipation in the bridge amplifier can occur. Not only are the power transistor losses minimized by this stratagem, but also these transistors, when providing 20 watts of output power, show no detectable temperature rise even when no heat sinks are used.

The output stage to the transducer load 34, as mentioned previously, consists of a step-up transformer 36. A d.c. blocking capacitor 37 is located in the line 30 to block any low frequency components.

Underwater transducers generally may be driven most efficiently with a sinewave. Thus it is clearly desirable to convert the squarewave output on line 30 from the transistor bridge to a sinewave. This is accomplished by placing a tuned coil 39 in electrical series with the transducer 34. The tuned coil 39 combines with the inherent shunt capacitance of the transducer 34 to form a series resonant circuit which may be tuned to the desired squarewave fundamental. This resonant circuit, by suppressing the squarewave harmonics and passing only the squarewave fundamental, converts the squarewave output to the sinewave fundamental before its application to the transducer 34.

This tuned coil 39 also provides protection for the transducer in the event of a short circuit. This is accomplished because, when there is a short circuit, the tuned coil 39 and the transducer shunt capacity are no longer at resonance and thus a high impedance is presented to this short-circuit current thus reducing the current to a safe value.

It should be noted at this point that this design lends itself directly to transformerless (output) design thereby making possible improved efficiency and reduced weight. Since the output transformer 36 is primarily for the purpose of stepping-up the voltage to the transducer, a transformerless output design may be implemented merely by providing a higher power source voltage and switching transistors which operate at this higher source voltage. Such a transformerless design is not feasible with a push-pull switching system since such a system inherently includes an output transformer.

This high-efficiency, switching-amplifier design may be used in a plate or pulse width modulation system, or simply as a noise transmitter.

To summarize the basic system, a block diagram of the switching amplifier is shown in FIG. 1. A signal generator 41 for generating a frequency, or set of frequencies to drive an underwater transducer 34 may be, for example, a pulse width modulator system or merely a noise generator. The signal from the generator 41 is applied to a signal conditioning system comprising a voltage follower 42 for impedance matching, a filter 46 for passing only a particular band of frequencies, a signal limiter 52 for clipping, a comparator 56 for converting the clipped voltages to a set of two voltage logic levels, and a timing and delay circuit 65 driven by a clock 62 for inserting a predetermined time delay before each change to a new voltage level.

The delayed, voltage, logic levels are applied to a driver 84 for switching its driver current in accordance with these voltage logic levels. This drive current energizes the transformers coupled to the arms of the switching amp 15 for switching a power source through this amplifier 15 to the transducer 34 in accordance with the switching of the driver 84. The output from the amplifier 15 is matched to the transducer 34 by the matching network 36 (transformer 36).

Obviously, many modifications and variations of the present invention are possible in light of the above teachings. It is therefore to be understood that, within the scope of the appended claims, the invention may be practiced otherwise than as specifically described.

What is claimed is:

1. A switching, power amplifier comprising:
    signal conditioner means for receiving a signal to be transmitted and converting said signal to a plurality of voltage logic levels;
    power source means;
    electrical load means;
    a plurality of switching means, arranged in a bridge configuration for switching a current from said power source means through said electrical load means to a ground potential;
    a plurality of voltage-transforming means, a different, voltage-transforming means coupled to each of said switching means for switching its respective switching means in accordance with a predetermined signal condition;
    driver means for receiving said plurality of voltage logic levels from said signal conditioner means and, energizing opposite pairs of voltage-transforming means in accordance with each voltage logic level change by first removing the power from the previously energized pair of voltage-transforming means and after a predetermined time delay approximately equal to the turn-off time of said switching means energizing the opposite pair of voltage-transforming means, said energized voltage-transforming means switching their respective switching means when those voltage-transforming means have reached said predetermined signal condition.

2. A switching power amplifier as defined by claim 1, wherein said switching means comprises a transistor.

3. A switching power amplifier as defined by claim 1, wherein said electrical load means comprises:
    transducer means; and
    inductive reactance means coupled in electrical series with said transducer means to form a series resonant circuit at a desired fundamental frequency.

4. A switching, power amplifier as defined by claim 1, wherein said signal conditioner comprises:
    a buffer amplifier,
    a bandpass filter coupled to the output of said buffer amplifier; and
    a voltage limiter coupled to said bandpass filter for converting the output from said bandpass filter to two voltage logic levels.

5. A switching power amplifier as defined in claim 1, wherein said voltage transforming means is a voltage transformer with at least one secondary winding and one primary winding.

6. A switching power amplifier as defined in claim 5, wherein said driver means comprises:
    a gate logic circuit including a shift register for adding a time delay to said voltage logic levels received from said signal conditioner means;
    an electrical switch connected to the output from said gate logic circuit and energized in accordance with said voltage logic levels; and
    a second power source coupled through the primaries of said plurality of voltage transformers and through said electrical switch to a ground potential.

7. A switching power amplifier as defined in claim 5, wherein the senses of said primary and secondary windings of said plurality of voltage transformers are chosen so that said switching means coupled to each voltage transformer is switched only when the current is collapsing in the primary of its respective voltage transformer.

8. A method for switching the switching means contained in the arms of a power amplifier bridge, each arm of said bridge being coupled to the signal to be transmitted through a voltage transformer having at least one primary winding, the voltage transformers in opposite arms of said bridge being connected to operate simultaneously as a pair, the method comprising the steps of:

receiving a signal to be transmitted;

converting said signal to be transmitted to voltage logic levels;

inserting a predetermined time delay before each voltage logic level change to prevent a bridge short circuit due to slow switching of said switching means;

running a current alternately through the primaries of the pairs of voltage transformers in accordance with said delayed, voltage logic levels; and upon the collapse of the current running through the primaries of a pair of transformers, switching into a conductive state said switch means coupled to those transformers.

* * * * *